JIG ALLOYING OF SEMICONDUCTOR DEVICES

Filed July 28, 1959 3 Sheets-Sheet 1

INVENTORS
ISRAEL H. KALISH &
SEYMOUR SILVERSTEIN

By W. S. Hill
AGENT

Dec. 13, 1960 I. H. KALISH ET AL 2,964,431

JIG ALLOYING OF SEMICONDUCTOR DEVICES

Filed July 28, 1959 3 Sheets-Sheet 2

INVENTORS
ISRAEL H. KALISH &
SEYMOUR SILVERSTEIN

BY W.S. Hill
AGENT

INVENTORS
ISRAEL H. KALISH &
SEYMOUR SILVERSTEIN
BY W. S. Hill
AGENT 2,964,431

JIG ALLOYING OF SEMICONDUCTOR DEVICES

Israel H. Kalish, South Bound Brook, and Seymour Silverstein, East Brunswick, N.J., assignors to Radio Corporation of America, a corporation of Delaware Filed July 28, 1959, Ser. No. 830,009
4 Claims. (Cl. 148—1.5)

Figure 1A:
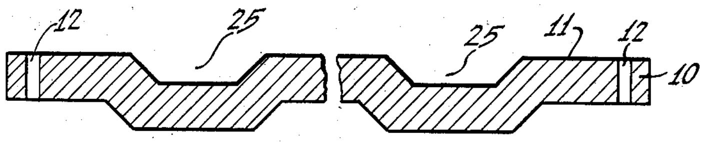
Figure 1B:
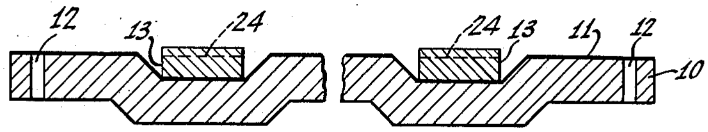

This invention relates to semiconductor devices, and more particularly to improved methods of fabricating junction type semiconductor devices.

One form of semiconductor device known as a triode transistor comprises a body of semiconductive material having three successive conductivity zones therein, connections to each zone, one rectifying barrier between the first and second zones, and another rectifying barrier between the second and third zones. Such units may be fabricated by alloying electrode dots of a given conductivity type-determining substance to opposing faces of an opposite conductivity type semiconductive pellet. In one such surface alloyed transistor, indium dots are fused to opposing faces of an N-type germanium pellet or wafer, as described by Law, Mueller, Pankove, and Armstrong, "A Developmental Germanium p-n-p Junction Transistor," Proc. IRE, vol. 40, page 1352, November 1952. The emitter connection is made to one indium dot, the collector connection to the other indium dot, and the base connection to the N-type wafer by means of a metal tab bonded to the wafer. The conductivity types of the various zones in such units may be reversed by utilizing donor-containing electrode dots on P-type germanium pellets, as described by Jenny, in "A Germanium n-p-n Alloy Junction Transitor," Proc. IRE, vol 41, page 1728, December 1953.

Triode transistors may also be fabricated by diffusion methods, or by a combination of fusion and diffusion processes. Such methods are particularly suitable for the fabrication of mesa transistors, in which a rectifying emitter contact and an ohmic base contact are made to a small plateau or mesa on one face of a given conductivity type semiconductive wafer. The mesa is previously diffused with an opposite conductivity type-determining substance, so that a PN junction is formed between the mesa and the bulk of the wafer. A method of fabricating such mesa transistors is described in U.S. 2,870,049, assigned to the same assignee.

Surface alloy transistors and mesa transistors are both fabricated in large quantities by mass production methods. However, each of the individual units presently requires a large number of hand operations. For example, each semiconductive pellet is placed by hand on a metal tab in a jig, and the pellets are bonded to the tabs. Subsequently, electrode dots are positioned on each pellet by hand, and the dots are then alloyed to the pellets. The tab becomes the base connection for surface alloyed transistors, or the collector connection for mesa transistors. All these separate handling operations tend to increase scrap, consume time, and increase the manufacturing cost.

An object of the present invention is to provide an improved method of making semiconductor devices.

Another object of the invention is to provide an improved method of making semiconductor devices containing one or more rectifying barriers.

In general, the improved processes and objects of this invention are accomplished by the provision of a separable jig for holding the semiconductive pellets in position during bonding and alloying steps, after which the jig is separated into metal tabs, each tab being bonded to a semiconductive pellet. Portions of the jig thus become portions of the completed devices.

The invention will be described in greater detail with reference to the accompanying drawing, wherein:

Figures 1*a*–1*g* are sectional views of successive steps in the fabrication of a semiconductor device according to one embodiment of the invention;

Figures 2*a*–2*g* are sectional views illustrating successive steps in the fabrication of a mesa transistor in accordance with another embodiment of the invention; and, Figures 3*a*–3*d* are sectional views of successive steps in the fabrication of a surface alloyed transistor according to another embodiment of the invention.

Similar elements are designated by similar reference numerals throughout.

Referring to Figure 1*a*, according to the invention, a sheet metal base 10 having an array of regular depressions 25 in one major face serves as a jig. Preferably the metal is selected from those such as nickel, rhodium, molybdenum, and alloys of nickel, cobalt, and iron, which are inert with respect to the semiconductor of choice. In this example, the jig or base 10 consists of nickel. The exact dimensions of the jig are not critical. In this embodiment, the jig 10 is about 1" by 1" by .010", and contains about 90 depressions. The depressions 25 are each about .050" square and .006" deep. The nickel jig 10 is preferably coated with a suitable solder 11, at least on the major face which contains the depressions 25. If desired, the entire jig may thus be coated. The solder 11 is selected from those which are appropriate with respect to the particular conductivity type and the specific semiconductor utilized. In this example, the solder consists of indium. It is convenient to provide the jig 10 with indexing means, such as a few peripheral apertures 12, for proper indexing of subsequent masking operations. The jig 10 may also be scored or perforated to facilitate subsequent separation into portions which become device tabs.

Next, a semiconductive pellet 13 (Figure 1*b*) is positioned in each depression 25. In this embodiment, the pellet 13 is composed of P-conductivity type germanium having a resistivity of about 0.15 to 0.35 ohm centimeters. The upper surface zone of pellet 13 has previously been diffused with a donor such as antimony, so that a PN junction 24 is formed between this upper surface zone and the bulk of the pellet. The jig 10 is loaded with a pellet 13 in each depression 25, taking care to position each pellet so that the P-type face thereof rests on the jig, and the assemblage of base and pellets is then heated in a non-oxidizing atmosphere to bond the pellets 13 to the bottoms of depressions 25. Suitable non-oxidizing ambients for all the heating operations mentioned herein are inert atmospheres such as argon, and reducing atmospheres such as hydrogen and forming gas. In this example, heating the assemblage for 3 to 4 minutes at about 350° C. in an atmosphere of forming gas has been found satisfactory.

Figure 1C:
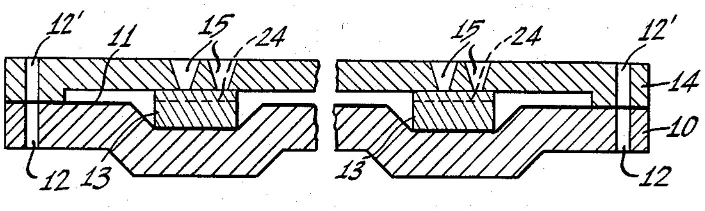

Referring now to Figure 1*c*, a mask 14 is then placed over the base 10 so as to cover the pellets 13 which have been bonded to the bottom of each depression. The mask 14 may be made of any suitable inert material, such as oxidized stainless steel or graphite, and is preferably provided with indexing means such as apertures 12' which correspond to the similar apertures 12 in the base. The mask 14 is thus accurately positioned over the base 10, and may be locked in place by means of metal pins (not shown) through apertures 12 and 12'. Mask 14 in this example is a stainless steel plate about 10 mils thick, and is provided with an array of paired openings 15, so that a pair of openings are positioned over the upper surface of each pellet 13. The openings 15 may have straight sides, or may be funnel-shaped, as in the instant embodiment.

Figure 1D:
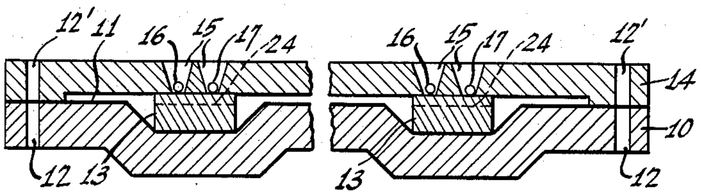

Next, a pair of metal electrode dots 16 and 17 are positioned on the upper surface of each pellet 13, as shown in Figure 1*d*, by simply dropping the dots into the openings 15. One dot 16 of each pair includes material which induces the same conductivity type as the bulk of the pellet. Since the upper surface of each pellet is of opposite conductivity type to the bulk of the pellet, dot 16 forms a rectifying contact to the upper surface of pellet 13 when alloyed thereto. The other dot 17 of each pair includes material which induces conductivity of type opposite to dot 16. Dot 17 therefore forms an ohmic contact to the upper surface of pellet 13 when alloyed thereto.

In this example, the bulk of each pellet 13 is P-type, the upper surface zone of each pellet is N-type, each rectifying electrode dot 16 is a 5 mil diameter spherule composed of 0.4–0.7% zinc, 0.5–0.8% gallium, balance indium, and each ohmic electrode dot 17 is composed of 59.7% tin, 39% lead, 1% zinc, and 0.3% antimony. The rectifying dots 16, which form the emitter contact, are inserted in one opening of each pair, and alloyed to the pellets 13 by heating the assemblage to 450° C. in an atmosphere of forming gas for 3 minutes. The assemblage is then cooled, and the ohmic dots 17, which form the base contact, are next inserted in the other opening of each pair. The base dots 17 are alloyed to the pellets 13 by reheating the assemblage to 400° C. in a forming gas ambient for 5 minutes. Masks of oxidized stainless steel, or of graphite, do not stick to the base 10 under these conditions. If desired, the emitter dots 16 and the base dots 17 may be simultaneously alloyed to the pellets 13 by using an intermediate heating profile.

Figure 1E:
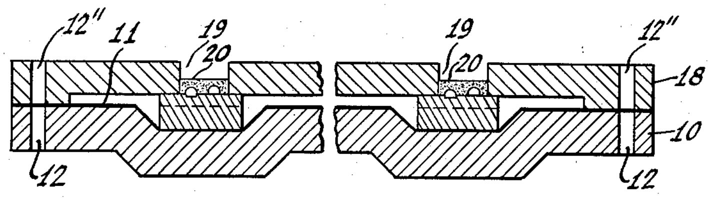

Referring now to Figure 1*e*, the first mask 14 is removed and a second inert mask 18 is accurately positioned over the base 10 by means of indexing apertures 12'', which correspond to the similar apertures 12 in base 10. Mask 18 is provided with an array of openings 19 which expose a surface area on each pellet 13 around the alloyed dots 16 and 17. In this example, the exposed area is a rectangle 8 mils wide and 16 mils long. A coating of acid-resist 20 is then deposited on the exposed area only of each pellet 13, including the electrode dots 16 and 17. Suitable acid-resists for this purpose are paraffin wax or fluorocarbon resins. In this example, the acid-resist is a plastic polymer of monochlotrifluoroethylene, which is commercially available under the registered trademark Kel-F.

Mask 18 is then removed, and the assemblage of base 10, pellets 13, and resist-covered dots 16 and 17 is treated in an etchant to remove the portion of the upper pellet surface not covered by the acid-resist. In this example, the etchant is a mixture of one drop 0.55% aqueous potassium iodide with 10 cubic centimeters of a solution containing 1 part hydrofluoric acid, 3 parts acetic acid, and 6 parts nitric acid. The etchant attacks the semiconductive pellets 13 much more rapidly than the jig 10. A mesa 21 containing the alloyed dot pair is thereby defined on the upper surface of each pellet, as shown in Figure 1*f*.

Figure 1F:
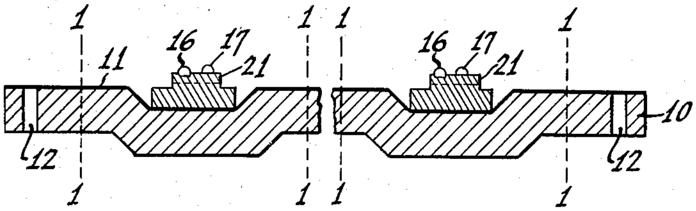
Figure 1G:
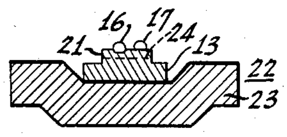

The acid-resist 20 is thereafter removed by a solvent, such as trichlorethylene, and the jig 10 is separated along first planes shown by the dashed lines 1—1 in Figure 1*f*, and also along second planes transverse to the first planes, thus forming a plurality of separate units. Separation may be accomplished by ultrasonic cutting tools, shears, cutting wheels, or masking and etching techniques. The separation is facilitated if the jig 10 has previously been scored or perforated along the desired lines of separation. One of the resulting units 22 is shown in Figure 1*g*. In this embodiment, each individual pellet 13 bears on one major face a pair of electrode dots 16 and 17 alloyed on a mesa 21, and is bonded on the opposite face to a metal tab which consists of a portion 23 of the original jig 10. The metal tab or portion 23 becomes the collector contact of the device. To complete the unit, it is only necessary to attach lead wires to each electrode dot, and, if desired, thereafter encapsulate and case the device by conventional methods.

It will be understood that the specific materials and dimensions recited in the above example are by way of illustration only, and are not a limitation. The conductivity types of the various regions may be reversed, any one of the crystalline semiconductive materials such as silicon, silicon-germanium alloys, and semiconductive compounds such as the phosphides, arsenides, and antimonides of aluminum, gallium, and indium may be utilized instead of germanium, together with appropriate conductivity type-determining substances.

Mesa transistors may also be fabricated according to the instant invention as illustrated in Figure 2. Referring to Figure 2*a*, the jig according to this embodiment is a metal base or sheet 30 with a coating 31 of solder on at least one major face. For convenience, the entire surface or sheet 30 may be solder coated. Preferably base 30 is provided with indexing means, such as a few peripheral apertures 32, for proper indexing of the masks subsequently utilized. Advantageously jig 30 is scored or perforated on one or both faces to facilitate separation of the jig into portions which will become device tabs.

Figure 2A:
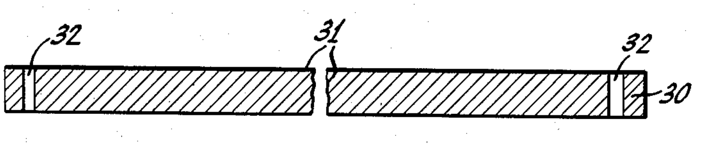
Figure 2B:
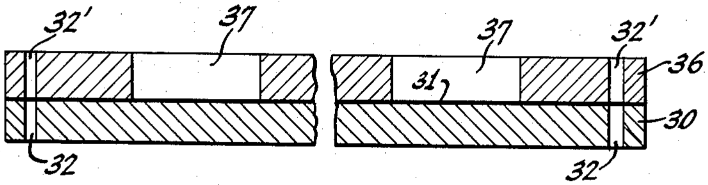

Referring to Figure 2*b*, an inert mask 36 having an array of regular openings 37 therein is placed over sheet 30. Mask 36 is provided with indexing means such as apertures 32', which correspond to the similar apertures 32 in the jig 30. Mask 36 may thus be accurately positioned over jig 30 and secured by means of metal pins (not shown) through apertures 32 and 32'.

Figure 2C:
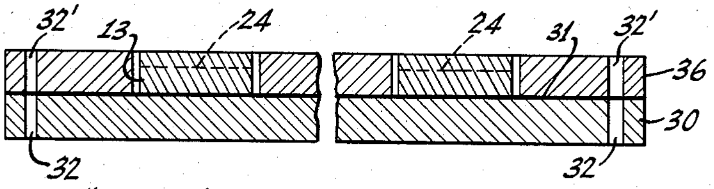

Next, a semiconductive pellet 13 is positioned in each opening 37 to rest on the solder-coated face of sheet 30, as shown in Figure 2*c*. Pellet 13 may be the same as in the previous embodiment, i.e., contain a surface zone of conductivity type opposite the bulk of the pellet, so that a rectifying barrier 24 is formed between the aforesaid surface zone and the bulk of the pellet. The assemblage of jig 30, mask 36, and pellets 13 is then heated in a non-oxidizing atmosphere to bond each pellet to the jig. Under these conditions, masks made of inert materials such as graphite or oxidized stainless steel will not bond to the jig.

Figure 2D:
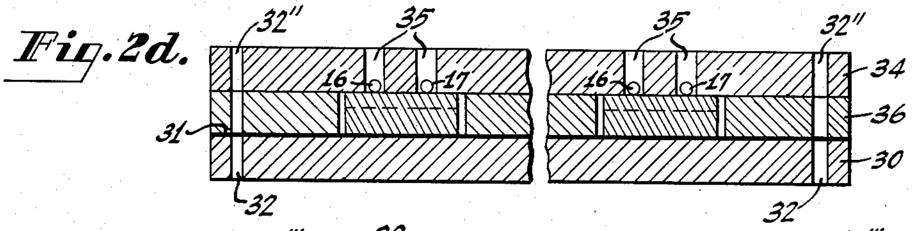

Referring now to Figure 2*d*, a second mask 34 is positioned over the first mask 36. Mask 34 preferably contains indexed apertures 32'' which match indexing apertures 32 of the jig, and is thus accurately positioned with respect to each wafer 13. Mask 34 is somewhat similar to mask 14 in that it contains an array of paired openings 35 arranged so that a pair of openings are positioned over the upper face of each pellet 13. In this embodiment, the openings have vertical sides. A pair of metal electrode dots 16 and 17 are then positioned on the upper face of each pellet 13 by dropping the dots into the openings 35. The assemblage of jig 30, mask 34, mask 36, pellets 13, and electrode dots 16 and 17 is then heated in a non-oxidizing atmosphere to alloy the dots to the pellets. As in the process first described above, one dot 16 is rectifying after alloying, while the other dot 17 of each pair is ohmic to the pellet surface zone.

Figure 2E:
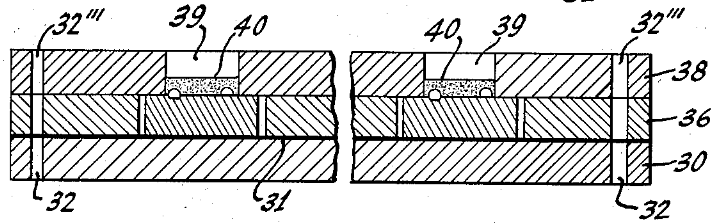

Referring now to Figure 2*e*, mask 34 is removed and a third mask 38 is positioned over mask 36 by means of indexing apertures 32''' which correspond to apertures 32 of the jig. Mask 38 contains an array of openings 39 which expose a surface area on each pellet including the alloyed dot pair. Only the exposed area and the alloyed dots are then covered with acid-resist 40.

Figure 2F:
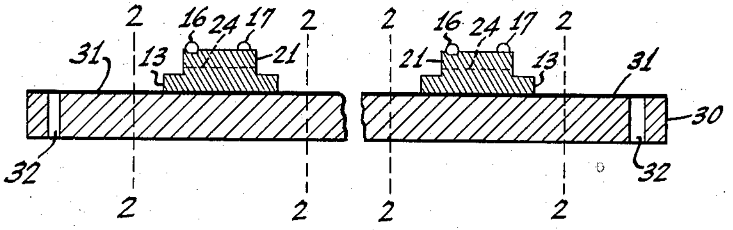
Figure 2G:
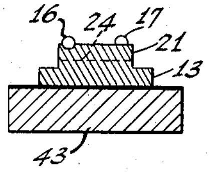

Next, masks 36 and 38 are removed, and the assemblage of jig 30, pellets 13, and electrode dots 16 and 17 is treated with a suitable etchant to define on each of the pellets a mesa 21 which contains a pair of alloyed electrode dots, as shown in Figure 2*f*. The acid-resist 40 is thereafter removed by a solvent, such as trichlorethylene, and the jig 30 is separated along first planes shown by the dashed lines 2—2 in Figure 2*f* and also along second planes transverse to the aforesaid planes, thus forming a plurality of discrete units. Separation may be quickly and conveniently accomplished by breaking the jig 30 along lines previously scored or perforated. A resulting unit 42, as shown in Figure 2*g*, comprises an individual semiconductive pellet 13 which bears on one face a pair of electrode dots 16 and 17 alloyed on a mesa 21, and is bonded on the opposite face to a metal tab which is a portion 43 of the original jig 30. Portion or metal tab 43 becomes the collector contact of the device. The unit may then be completed by attaching lead wires to each electrode dot, and, if desired, thereafter encapsulating and casing the device by methods known to the art.

In addition to the saving of time and the reduction of hand operations over the prior art methods of transferring individual pellets to individual metal tabs, bonding the pellets to the tabs, and alloying electrode dots to the pellets, the above process according to the invention has another important advantage, in that scrap is greatly reduced. In the prior art methods, the mesa is formed first on each pellet, and it is then necessary to alloy two electrode dots on the resulting small mesa surface without short circuiting the dots to each other or to the collector portion of the pellet. In the process of the invention as described above, the electrode dots are alloyed first, and the mesa is subsequently formed around the alloyed electrodes, thereby greatly reducing the number of short circuits.

Many modifications of the above methods may be made without departing from the spirit and scope of the instant invention. For example, when silicon is used as the semiconductive pellet material, the rectifying and ohmic contacts 16 and 17 may be made by diffusion of vaporized type-determining substances such as aluminum and antimony-gold through mask 34, instead of alloying the impurity substances as described above. In the embodiment illustrated in Figure 2, the first mask 36 may be removed before the second mask 34 is positioned on the jig 30.

Figures 3A, 3B, 3C, 3D:
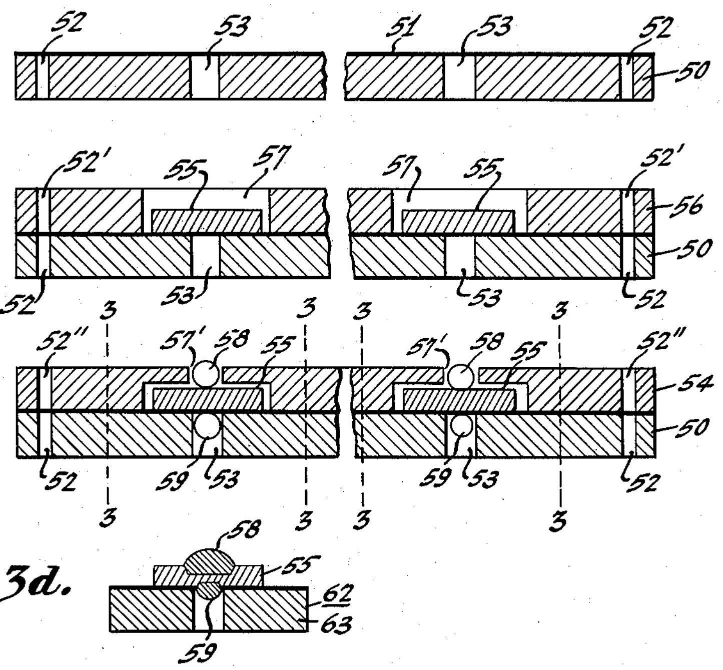

Surface alloyed devices may be fabricated in accordance with another embodiment of the invention, as illustrated in Figure 3. A jig 30 is prepared from a metal sheet having an array of apertures 53, as shown in Figure 3*a*. Preferably sheet 50 is provided with indexing means, such as a number of indexing apertures 52. At least one major face of sheet 50 is covered with a solder coating 51. Advantageously the metal sheet 50 is either scored or perforated on one or both major faces.

Referring to Figure 3*b*, a mask 56 is positioned over jig 50 by means of indexing apertures 52′, which correspond to indexing means 52 of the jig. Mask 56 contains therein an array of regular openings 57, so that each opening defines a surface area of sheet 50 around one of said apertures 53. A semiconductive pellet 55, which may for example be N-type gallium arsenide, is positioned within each opening 57 of mask 56 so as to rest on the solder-coated face of sheet 50 over a jig aperture 53. The assemblage of jig 50, mask 56, and pellets 55 is heated in a non-oxidizing atmosphere to bond each said pellet to the sheet 50 over an aperture 53.

Next, mask 56 is removed, and a second mask 54 is positioned over jig 50 by means of indexing apertures 52″ in the mask, which, as shown in Figure 3*c*, correspond to indexing apertures 52 in the jig. Mask 54 contains an array of openings 57′ which coaxially correspond to the array of apertures 53 in jig 50. Acceptor electrode dots 58, which in this example consist of a soft indium-cadmium alloy, are dropped through openings 57′ to rest on one face of semiconductive pellet 55. Similar electrode dots 59 are pushed through openings 53 so as to adhere to the opposite face of pellets 55. The assemblage of jig 50, mask 54, semiconductive pellets 55, and electrode dots 58 and 59 are then heated in a non-oxidizing atmosphere to alloy said dots to said pellets. If desired, the alloying of the collector dots 58 and the emitter dots 59 may be performed in separate steps. The jig 50 is then separated along planes shown by dashed lines 3—3 in the drawing, and along transverse planes, to form separate units. A unit 62 thus formed comprises a semiconductive pellet 55, an emitter electrode 59, and a collector electrode 58. The semiconductive pellet 55 is mounted on a metal tab 63 which is a portion of the original sheet 50, and serves as the base tab of the device. The unit is completed by attaching wire leads to each electrode, and, if desired, potting and casing the device by known techniques.

Alternatively, surface alloyed devices may be fabricated utilizing a jig with depressions somewhat similar to that shown in Figure 1. A solder-plated sheet metal base is prepared with an array of regular depressions in one major face, each depression having an aperture therein. Semiconductive pellets are positioned in each depression, and bonded to the bottoms of the depressions by heating the assemblage of pellets and base in a non-oxidizing atmosphere such as a reducing or an inert atmosphere. A first metal electrode dot is then positioned within each jig aperture on one face of the semiconductive pellet, and a second electrode dot is coaxially positioned on the opposite pellet face. The assemblage of base, pellets, and dots is heated in a reducing or inert atmosphere to alloy the dots to the pellets. Thereafter the base sheet is separated into a plurality of metal tabs, each tab being bonded to a semiconductive pellet which has a pair of electrode dots alloyed to opposite faces thereon.

What is claimed is:

1. The method of fabricating semiconductor devices utilizing a jig which becomes a portion of the completed device, comprising preparing a solder-plated sheet metal base with an array of regular depressions in one major face thereof; positioning a semiconductive pellet in each said depression; heating said base and said pellets in a non-oxidizing atmosphere to bond said pellets to the bottoms of said depressions; positioning a pair of metal electrode dots on each pellet; heating the assemblage of said base, said pellets, and said dots in a non-oxidizing atmosphere to alloy said dots to said pellets; masking said pellets to expose on each a surface area including each said pair of alloyed dots; depositing an acid-resist on said exposed areas only; etching said assemblage to define on each said pellet a mesa containing said alloyed dot pair; and separating said base into a plurality of tabs, each tab being bonded to a semiconductive pellet which has a pair of electrode dots alloyed on a mesa.

2. The method of fabricating semiconductor devices utilizing a jig which becomes a portion of the completed device, comprising preparing a solder-plated metal sheet; covering one face of said sheet with a mask having an array of openings therein; positioning a semiconductive pellet within each said opening so as to rest on said sheet; heating the assemblage of said sheet, said mask, and said pellets in a non-oxidizing atmosphere to bond said pellets to said sheet; positioning a pair of metal electrode dots on each pellet; heating the assemblage of said sheet, said pellets, and said dots in a non-oxidizing atmosphere to alloy said dots to said pellets; masking said pellets to expose on each a surface area including each said pair of alloyed dots; depositing an acid-resist on said exposed areas only; etching said assemblage to define on each said pellet a mesa containing said alloyed dot pair; and separating said sheet into a plurality of tabs, each tab being bonded to a semiconductive pellet which has a pair of electrode dots alloyed on a mesa.

3. The method of fabricating semiconductor devices utilizing a jig which becomes a portion of the completed device, comprising preparing a solder-plated sheet metal base with an array of regular depressions in one major face thereof, each depression having an aperture therein; positioning a semiconductive pellet in each said depression; heating said base and said pellets in a non-oxidizing atmosphere so as to bond said pellets to the bottoms of said depressions; positioning a first metal electrode dot within each said aperture on one face of said pellet; coaxially positioning a second electrode dot on the opposite pellet face; heating the assemblage of said base, said pellets, and said dots in a non-oxidizing atmosphere to alloy said dots to said pellets; and separating said base into a plurality of tabs, each tab being bonded to a semiconductive pellet which has a pair of electrode dots alloyed to opposite faces thereon.

4. The method of fabricating semiconductor devices utilizing a jig which is separable into portions of the completed device, comprising preparing a solder-plated metal sheet having an array of apertures therein; covering one face of said sheet with a mask having an array of openings, so that each opening defines a surface area of said sheet around one of said apertures; positioning a semiconductive pellet over said aperture within each said opening to rest on said sheet; heating the assemblage of said sheet, said mask and said pellets in a non-oxidizing atmosphere to bond said pellets to said sheet; affixing a first metal electrode dot within each said aperture on one face of said pellet; coaxially positioning a second electrode dot on the opposite pellet face; heating the assemblage of said sheet, said pellets and said dots in a non-oxidizing atmosphere to alloy said dots to said pellets; and separating said sheet into a plurality of tabs, each tab being bonded to a semiconductive pellet which has a pair of electrode dots alloyed to opposite faces thereon.

References Cited in the file of this patent

UNITED STATES PATENTS

| | | |
|---|---|---|
| 2,754,455 | Pankove | July 10, 1956 |
| 2,759,133 | Mueller | Aug. 14, 1956 |
| 2,778,980 | Hall | Jan. 22, 1957 |
| 2,796,563 | Erbers et al. | June 18, 1957 |
| 2,900,287 | Bestler et al. | Aug. 18, 1959 |
| 2,900,584 | Bottom | Aug. 18, 1959 |